US009548543B2

(12) United States Patent
Subbaraman et al.

(10) Patent No.: US 9,548,543 B2
(45) Date of Patent: Jan. 17, 2017

(54) METHOD FOR FABRICATING AND PACKAGING AN M×N PHASED-ARRAY ANTENNA

(71) Applicants: Harish Subbaraman, Austin, TX (US); Xiaochuan Xu, Austin, TX (US); Yihong Chen, Austin, TX (US); Ray T. Chen, Austin, TX (US)

(72) Inventors: Harish Subbaraman, Austin, TX (US); Xiaochuan Xu, Austin, TX (US); Yihong Chen, Austin, TX (US); Ray T. Chen, Austin, TX (US)

(73) Assignee: Omega Optics, Inc., Austin, TX (US)

( * ) Notice: Subject to any disclaimer, the term of this patent is extended or adjusted under 35 U.S.C. 154(b) by 275 days.

(21) Appl. No.: 14/591,908

(22) Filed: Jan. 7, 2015

(65) Prior Publication Data

US 2016/0197411 A1 Jul. 7, 2016

(51) Int. Cl.
*H01Q 21/00* (2006.01)
*H01Q 1/38* (2006.01)
*H01Q 21/06* (2006.01)
*H05K 3/12* (2006.01)

(52) U.S. Cl.
CPC ............ *H01Q 21/0087* (2013.01); *H01Q 1/38* (2013.01); *H01Q 21/061* (2013.01); *H05K 3/125* (2013.01); *H05K 2201/09918* (2013.01); *H05K 2203/013* (2013.01)

(58) Field of Classification Search
CPC ................... H05K 3/125; H05K 2201/09918; H05K 2203/013; H01Q 1/38; H01Q 21/0087; H01Q 21/061
See application file for complete search history.

(56) References Cited

U.S. PATENT DOCUMENTS

| 7,050,011 B2* | 5/2006 | Ghabra | H01Q 1/3241 343/700 MS |
| 7,057,562 B2* | 6/2006 | Forster | G06K 19/07749 29/600 |
| 7,323,993 B2* | 1/2008 | Fein | G06K 19/07749 340/572.1 |
| 7,598,873 B2* | 10/2009 | Yamagajo | G06K 19/07786 340/572.7 |

* cited by examiner

*Primary Examiner* — Carl Arbes
(74) *Attorney, Agent, or Firm* — Taboada Law Firm, PLLC; John M. Taboada (57) ABSTRACT

A method for fabricating an M×N, P-bit phased-array antenna on a flexible substrate is disclosed. The method comprising ink jet printing and hardening alignment marks, antenna elements, transmission lines, switches, an RF coupler, and multilayer interconnections onto the flexible substrate. The substrate of the M×N, P-bit phased-array antenna may comprise an integrated control circuit of printed electronic components such as, photovoltaic cells, batteries, resistors, capacitors, etc. Other embodiments are described and claimed.

16 Claims, 9 Drawing Sheets

METHOD FOR FABRICATING AND PACKAGING AN M×N PHASED-ARRAY ANTENNA

I. STATEMENT REGARDING FEDERALLY SPONSORED RESEARCH

This invention was made with government support under contracts N00014-11-C-0704 and NNX09CA37C awarded by the Office of Naval Research (ONR) and National Aeronautics and Space Administration (NASA), respectively. The government has certain rights in the invention.

II. BACKGROUND

Field of the Invention

The present disclosure relates generally to the field of printed antenna and electronics, and more specifically to radiating antenna array and electronics integrated on a flexible substrate, and various applications of the same.

Background of the Invention

The statements in this section merely provide background information related to the present disclosure and may not constitute prior art.

Recently, flexible antenna have become more attractive due to the development of several interesting flexible circuit components that can be integrated into one system on a light weight, conformal flexible platform. Since different communication tasks require different antenna technologies, a flexible antenna is important for several communication applications. Unlike the "printed antennas" fabricated on rigid printed circuit boards using etching processes, the printed antennas on flexible substrates may be fabricated using solution processing techniques, such as ink jet printing, screen printing, offset printing etc., and it is possible to wed flexible electronics manufacturing with antenna circuit design, in order to develop multifunctional, low-cost, light weight, easy-to-fabricate conformal antenna systems on flexible substrates such as metal films, plastics, paper, cardboard, cloth such as for clothing, etc. The printed antennas on flexible substrates are rollable, foldable, and light-weight, thus making them highly attractive for several applications.

A very important flexible antenna system, namely the phased-array antenna (PAA), is formed by combining the flexible antenna elements and electronics, such as transmit/receive (T/R) modules for controlling the system, onto a single flexible substrate. Phased-array antenna systems have many advantages over mechanically steered antenna arrays in terms of speed, sensitivity, and size. They are critical components for modern military and commercial radar and wireless communication systems.

A conventional way of fabricating flexible phased-array antennas is via fabricating discrete components, such as control chips, antenna elements, etc. separately, and then integrating the discrete components on a flexible substrate, such as a canvas. Although the dual purpose of conformality and functionality are achieved through this conventional method, the antenna assemblies consist of several discrete parts, which require separate fabrication and packaging processes, resulting in complex integration and increased cost. Additionally, with the conventional method it is not possible to integrate other electronic devices such as batteries, solar cells, RFID, memories, displays, etc. to provide additional functionalities. Therefore, what is needed in the art is a phased-array antenna system that provides conformality and functionality as well as integration with other electronic devices such as batteries, solar cells, RFID, memories, displays, etc. Additionally, such a system should also minimize fabrication complexity and lower the cost.

III. SUMMARY

A printed phased-array antenna system incorporating the functional antenna elements integrated together with printed transistors on the same substrate is disclosed. The phased-array antenna system comprises a flexible substrate on which the antenna array system together with associated circuitry is printed, and a printed interconnection layer on top to enable control of the electronics from the sides. The phased-array antenna system may further comprise an integrated control circuit having printed electronic components such as photovoltaic cells, batteries, resistors, capacitors, etc.

An aspect of the present invention provides a method of manufacturing an M×N, P-bit phased-array antenna on a flexible substrate together with electronic devices. The method comprising: forming the antenna elements, transmission lines, phase-shifters, and RF couplers on one side of the substrate; forming an antenna ground plane on the substrate on the side opposite to that containing the antenna elements; forming transistors in the phase-shifters; forming a dielectric coating with interconnection holes; and depositing a liquid conductive material on top to form interconnection lines and fill the interconnection holes.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

To summarize:

The primary objective of the invention is to simplify the fabrication and integration of phased-array antennas and electronics onto a flexible substrate by fabricating both the phased-array antennas and electronics concurrently using an ink jet printing process.

The second objective is to package the printed phased-array utilizing an ink jet printed multilayer interconnection approach, which will enable reliable control of the phased-array without the utilization of complex circuitry.

Other objectives and advantages of the present invention will become apparent from the following descriptions, taken in connection with the accompanying drawings, wherein, by way of illustration and example, an embodiment of the present invention is disclosed.

IV. BRIEF DESCRIPTION OF THE DRAWINGS

The drawings constitute a part of this specification and include exemplary embodiments of the present invention, which may be embodied in various forms. The drawings described herein are for illustrative purposes only of selected embodiments and not of all possible implementations, and are not intended to limit the scope of the present disclosure in any way. It is to be understood that in some instances, various aspects of the present invention may be shown exaggerated or enlarged to facilitate an understanding of the invention.

A more complete and thorough understanding of the present invention and benefits thereof may be acquired by referring to the following description together with the accompanying drawings, in which like reference numbers indicate like features, and wherein.

V. DETAILED DESCRIPTION

Detailed Description of the Invention

Detailed descriptions of the preferred embodiments are provided herein. It is to be understood, however, that the present invention may be embodied in various forms. The specific details disclosed herein are not to be interpreted as limiting, but rather as a basis for the claims and as representative basis for teaching one skilled in the art to employ the present invention in virtually any appropriately detailed system, structure, or manner. In all the accompanying drawings, same numerals are used within each figure to represent the same or similar materials, and redundant descriptions are omitted.

Figure 1A:
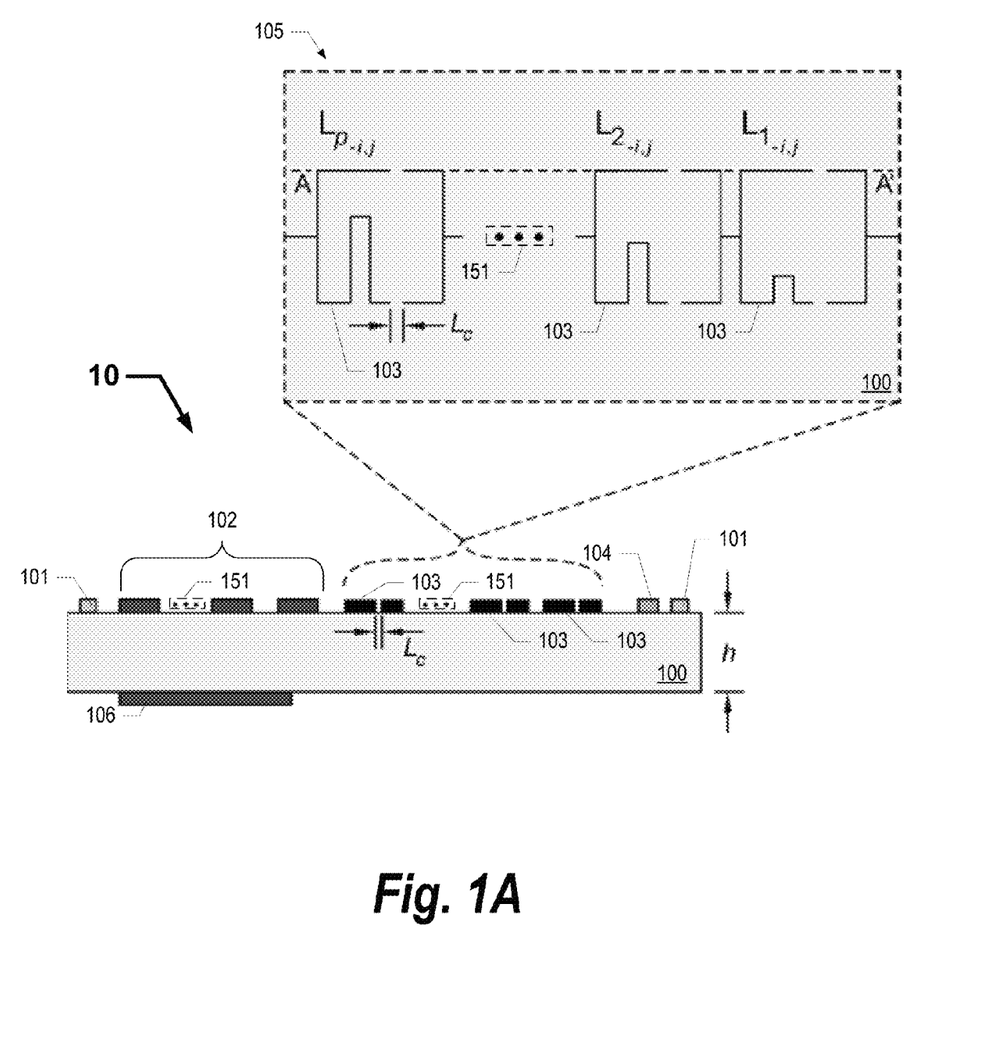
FIGS. 1A to 1F are schematic drawings showing side and top views of the manufacturing steps of the ink jet printed phased-array antenna, in accordance with some embodiments.

FIGS. 1A to 1F show side and top views of the manufacturing process of an ink jet printed phased-array antenna 10 according to one embodiment of the present invention. Initially, as illustrated in FIG. 1A, a first layer, comprising alignment marks 101, M×N antenna elements 102, transmission lines 103, and an RF coupler 104 are ink-jet printed on top of the substrate 100 of height h and subsequently cured (hardened). M and N may each range from 1 to 100. Ink-jet printing and hardening of the first layer comprises determining a position for the one or more alignment marks on the substrate; determining positions for the RF coupler, the M×N antenna elements, and the transmission lines relative to the position of the one or more alignment marks; depositing a material on the substrate at the position for the one or more alignment marks, at the position for the RF coupler, at the position for the M×N antenna elements, and at the position for the transmission lines, wherein the material comprises at least one of: silver, copper, aluminum, gold, conductive polymer, graphene, and carbon nanotubes; and curing the material, wherein curing the material comprises: irradiating the material with UV, heating the material, exposing the material to high power, short light pulses, and/or air drying the material. The multiple sets of three dots in series 151 signify that other devices and objects have not been shown for clarity, but it is understood that a particular number of non-illustrated devices and objects are to be included in order to comprise the M×N, P-bit phased-array antenna, where P may range from 2 to 8. The transmission lines 103 within the phase shifter region 105, which is shown in an exploded view from top, feeding an antenna element in the i-th row and j-th column (i=1, 2, ..., N; j=1, 2, ..., M) include channel gaps of length $L_c$ that will be utilized to form transistor channels in later steps. For clarity of the individual components of the first layer, the side view illustrations of FIGS. 1A to 1F do not show the complete transmission lines which interconnect the RF coupler, phase shifters, and M×N antenna elements. The transmission lines which interconnect the components are illustrated in FIG. 2A to 2C. The channel gaps $L_c$ range in length from about 1 micron to about 100 microns. Depending on the specific type of antenna design used, a metal ground plane 106 may also be ink jet printed on the substrate 100 on the side opposite to that containing the antenna elements 102. The top view of the phase shifters 105 feeding an antenna element in the i-th row and j-th column of the M×N antenna elements 102 illustrates a P-bit phase shifter, comprising different lengths of transmission lines $L_{1-i,j}, L_{2-i,j}, \ldots, L_{P-i,j}$ in one arm, where lengths $L_{1-i,j}, L_{2-i,j}, \ldots, L_{P-i,j}$ are chosen to achieve steering at desired angles. There are 2×P channel gaps in order to accommodate for 2×P transistors in the following fabrication steps for each phase shifter region 105.

The substrate may comprise any flexible material, such as metal films, plastics, paper, cardboard, and cloth such as for clothing. The substrate may be made into any arbitrary shape and may be in the form of sheets or rolls. The substrate may comprise electronic circuitry on the backside, embedded within, or on top of the substrate, wherein the electronic circuitry is configured to transmit electrical signals. Electronic devices may also be developed on top of the substrate using printing techniques. In the present invention, the alignment marks may comprise metal, dyes, color pigments, etc. which turn opaque upon hardening and may be patterned into any shape and size. The M×N antenna elements, the transmission lines, and the RF coupler, may comprise any of the plurality of materials, including but not limited to, silver, copper, aluminum, gold, conductive polymers, graphene, and carbon nanotubes. One such conductive polymer is SU-8 2002 (SU-8) polymer from MicroChem Corp. that may be hardened through the use of any of the plurality of curing methods, including but not limited to, heating; exposing to UV radiation; exposing to high power, short light pulses; or air drying.

As shown in FIG. 1A, the first layer, comprising the alignment marks 101, the M×N antenna elements 102, the transmission lines 103, and the RF coupler 104, is ink-jet printed on top of the substrate 100 and subsequently cured. One such ink jet printer is a Fujifilm Dimatix Materials Printer (DMP-2800). The printer utilizes a piezoelectric cartridge to jet material onto the desired area on the substrate. The range of materials that may be ink jetted is broad and depends on the material viscosity. The viscosity should range between 10 and 12 cP ($1.0 \times 10^{-2}$ to $1.2 \times 10^{-2}$ Pa·s) and the surface tension should range between 28 and 33 dynes/cm (0.028 to 0.033 N/m) at operating temperature. This type of non-contact printing method can easily be extended to a roll-to-roll process.

Figure 1B:
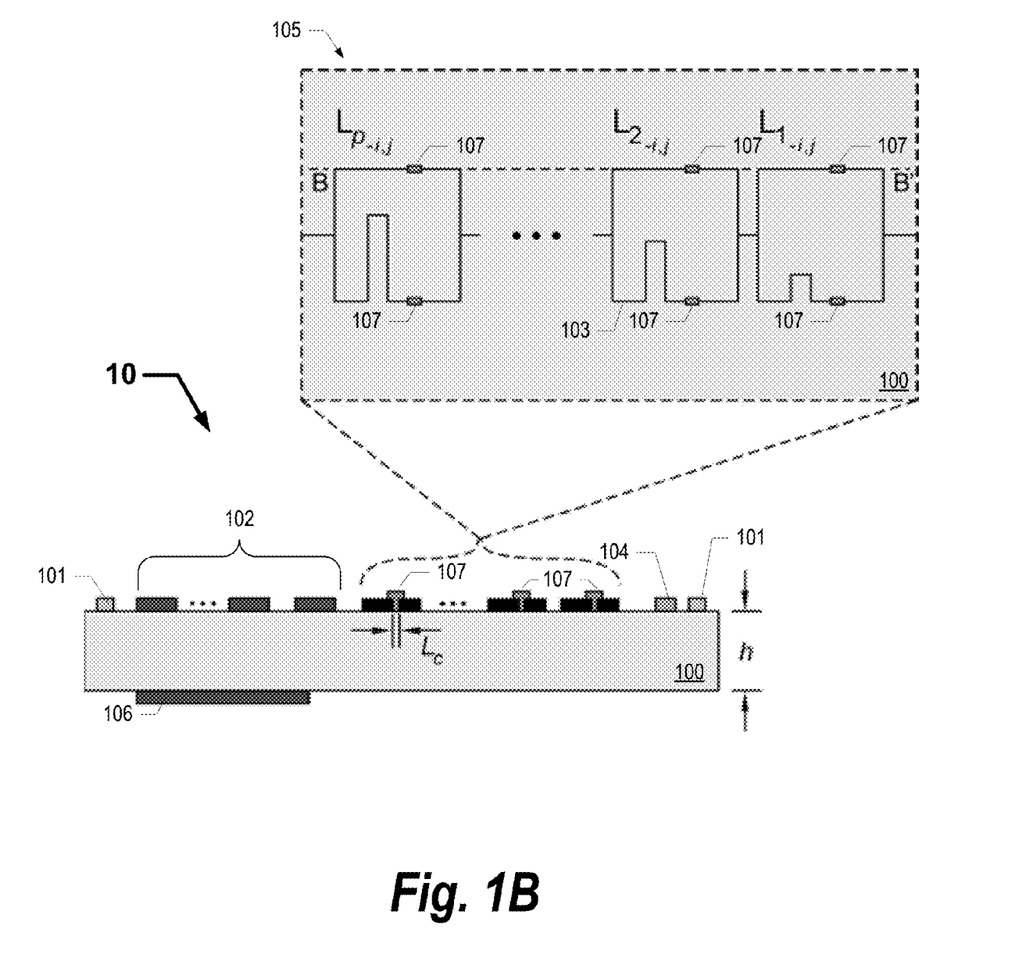
Figure 2A:
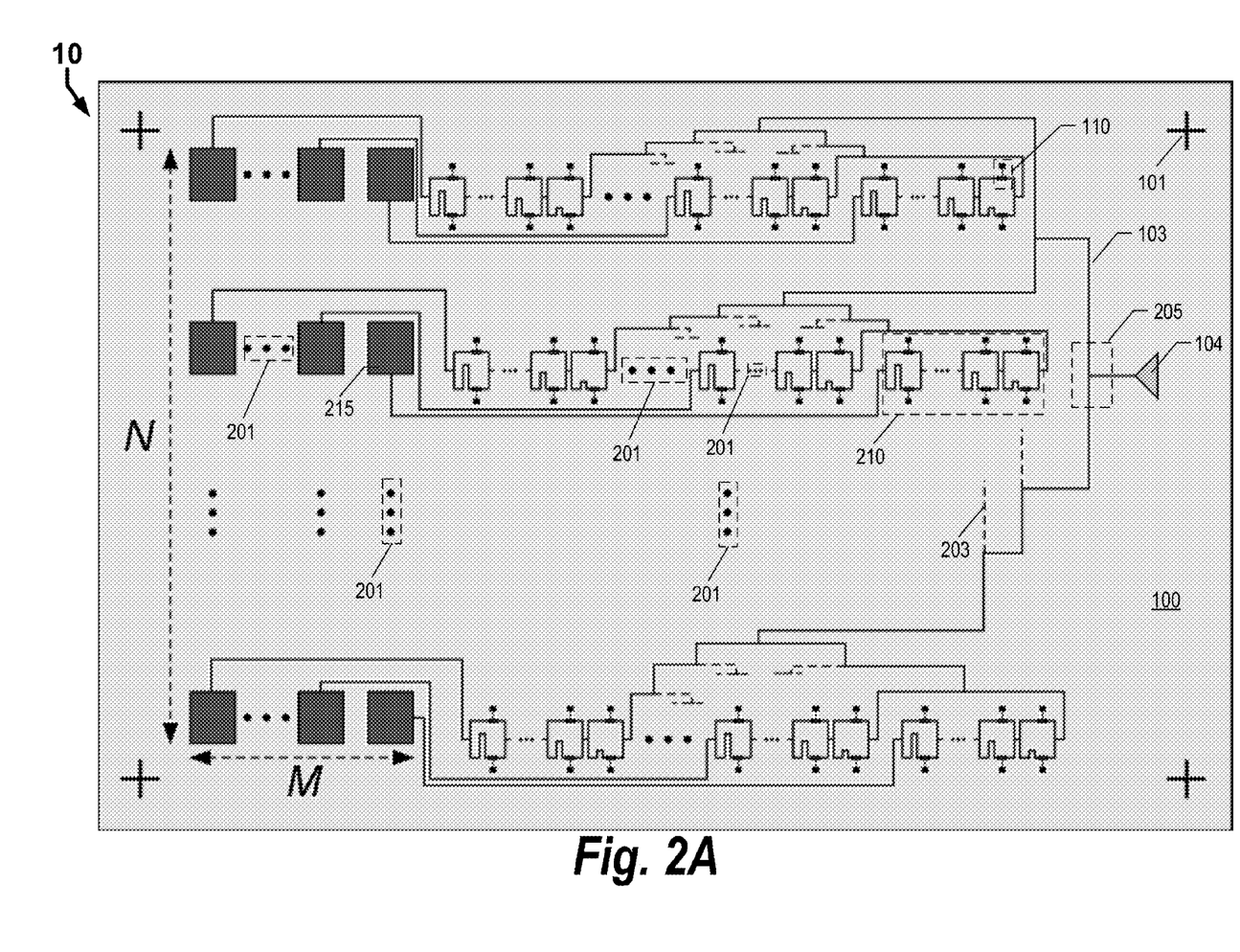
FIGS. 2A to 2C are schematic drawings showing the top view of the ink jet printed phased-array antenna device, corresponding to the side views shown in FIGS. 1D to 1F, respectively, in accordance with some embodiments.
Figure 2B:
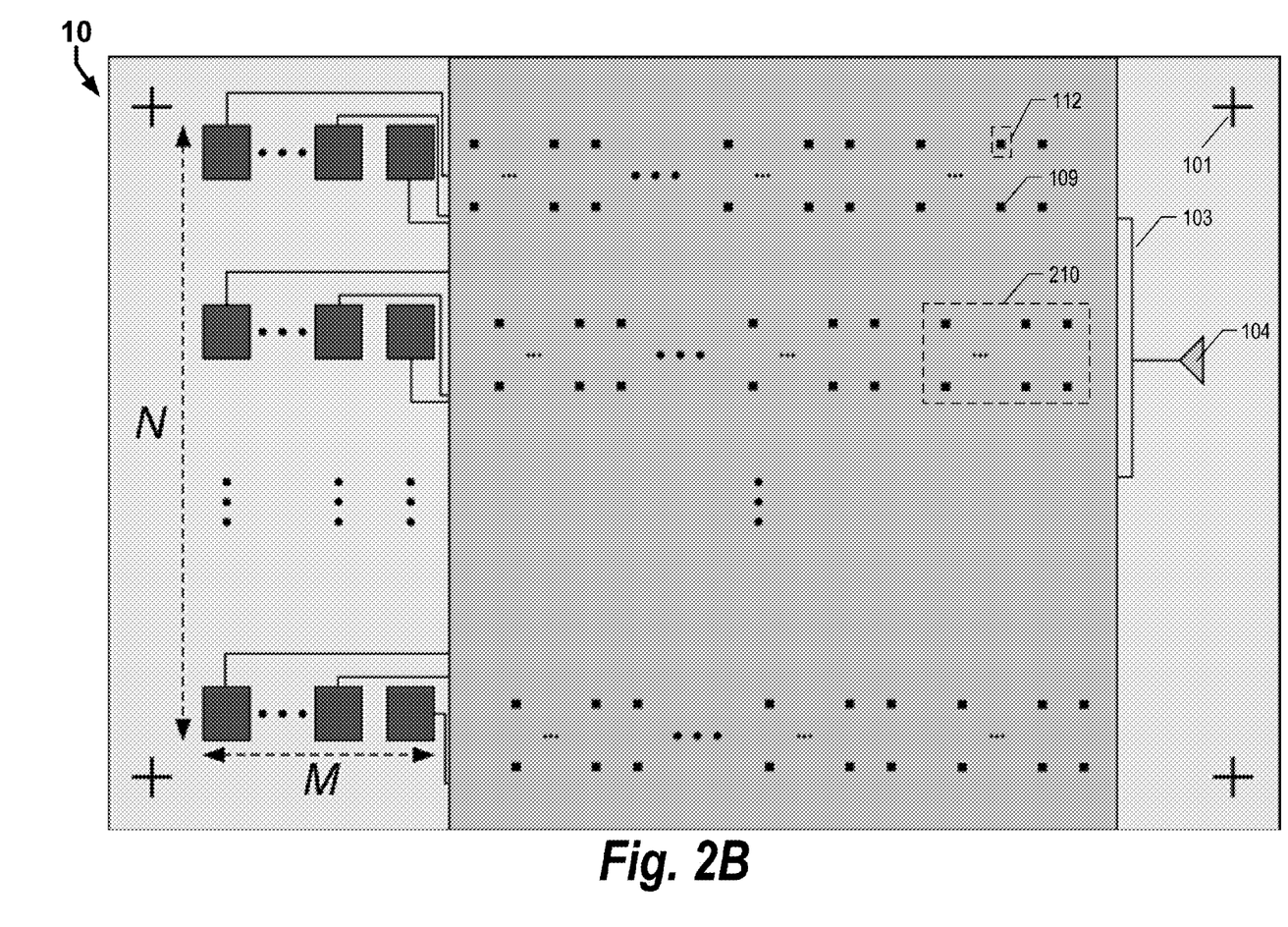
Figure 2C:
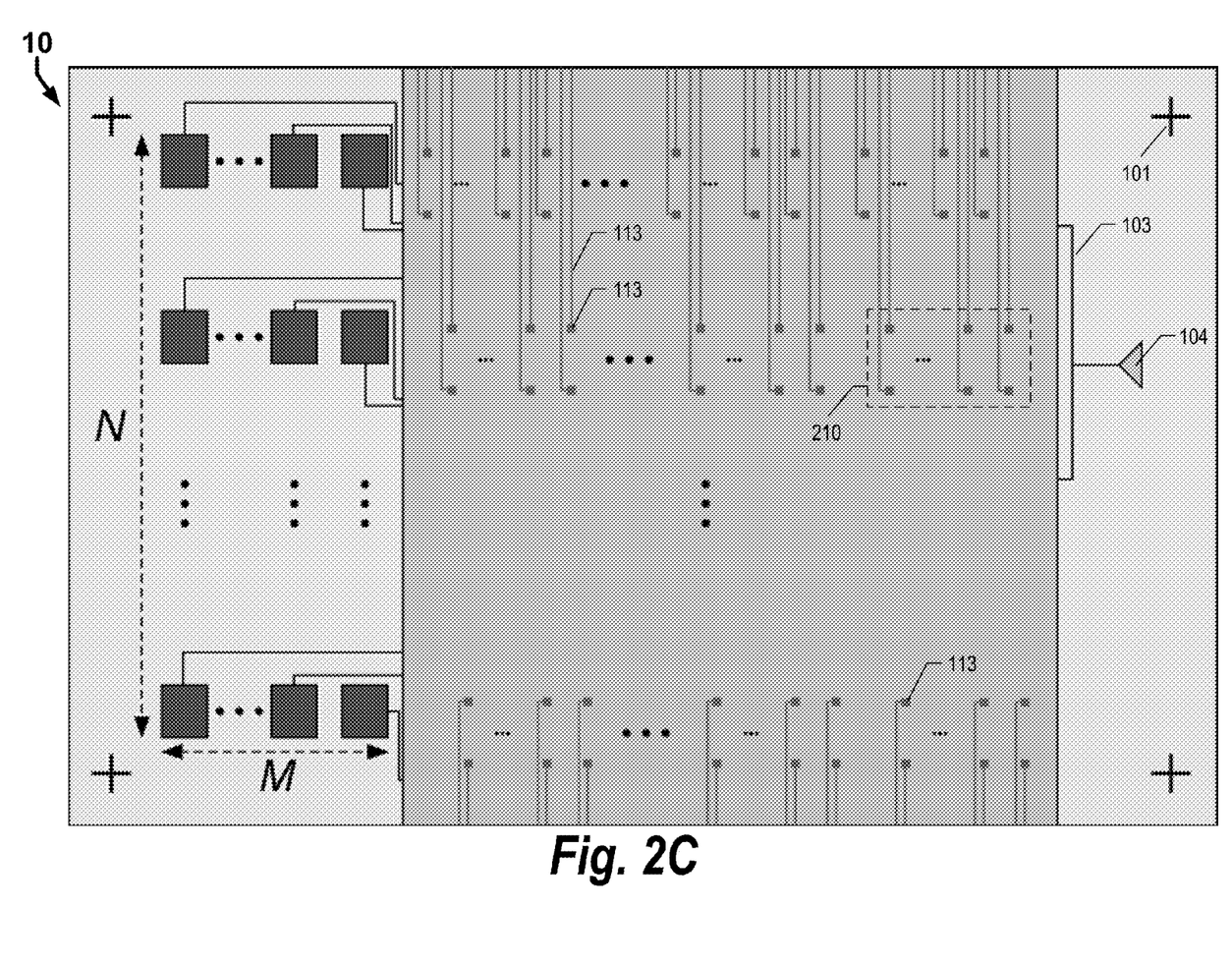

After printing of the first layer, a first semiconductor layer 107 is ink jet printed and hardened in and adjacent to the channel gap regions $L_c$ of each of the phase shifters as illustrated in FIG. 1B. The first semiconductor layer fills the channel gap regions $L_c$ as well as covers some of the transmission lines adjacent to the channel gap regions. The material for the first semiconductor layer 107 may comprise any liquid semiconductor material solution, such as carbon nanotubes, graphene, organic semiconductors, and/or silicon nanoparticles. In order to determine the position for ink jet printing the first semiconductor layer 107, the alignment marks 101 are detected using an optical alignment system, and the position for the first semiconductor layer 107 is determined with respect to the position of the detected alignment marks 101. After ink jet printing, the first semiconductor layer 107 is cured (hardened), using any of the plurality of curing methods, including but not limited to, heating; exposing to UV radiation; exposing to high power, short light pulses; or air drying. The top view of the phase shifters 105 feeding an antenna element in the i-th row and j-th column of the M×N antenna elements 102 shows the 2×P channel gaps covered with the first semiconductor layer 107. The side view of the ink jet printed phased-array antenna 10 illustrated in FIG. 1B shows the cross-sectional view of the phase shifter region 105 taken along line B-B' of the top view of the phase shifters 105 of FIG. 1B.

Figure 1C:
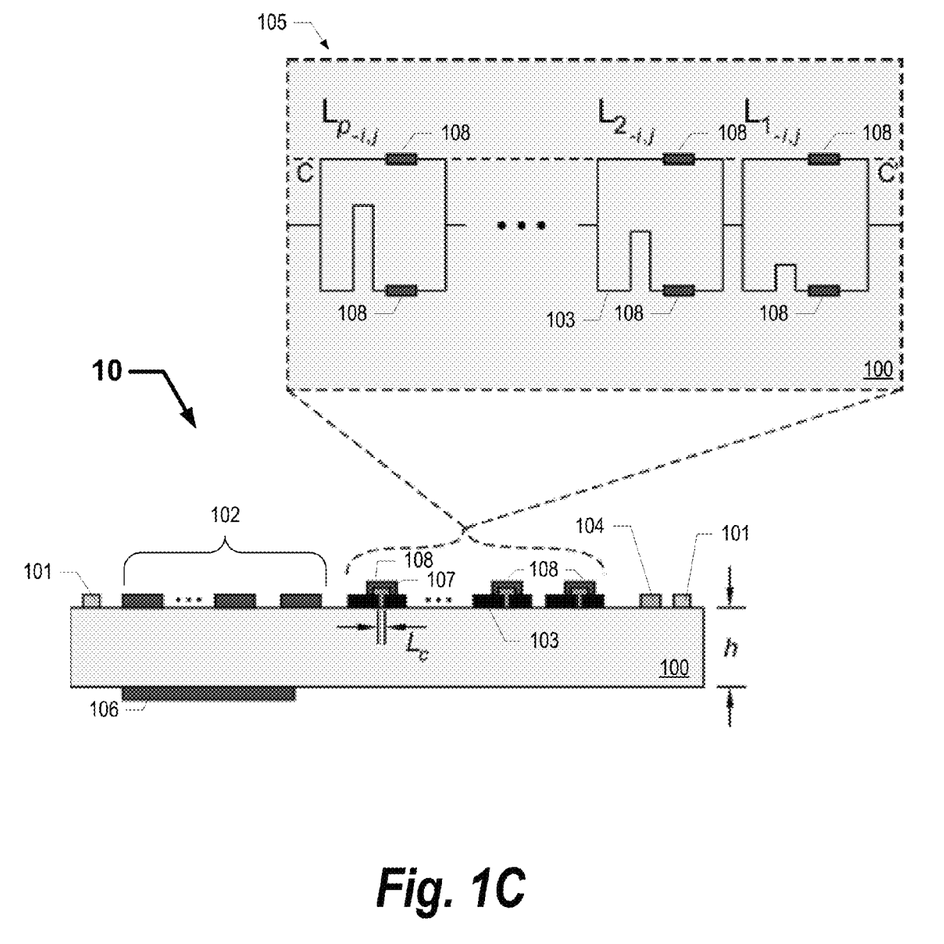

Next, a first dielectric layer 108 is ink-jet printed and hardened on top of the first semiconductor layer 107 of each of the phase shifters, as illustrated in FIG. 1C, such that it substantially covers the first semiconductor layer 107 and partially covers the transmission lines 103 and the substrate 100. The material for the first dielectric layer 108 may comprise any of the plurality of materials, including but not limited to, a conductive polymer such as SU-8, ion-gel, etc. which can be hardened through the use of any of the plurality of curing methods, including but not limited to, heating; exposing to UV radiation; exposing to high power short light pulses; and air drying. In order to determine the position of printing on top of the first semiconductor layer 107, the alignment marks 101 are detected using an optical system, and the position of printing is determined with respect to the position of the detected alignment marks. The top view of the phase shifters 105 feeding an antenna element in the i-th row and j-th column of the M×N antenna elements 102 shows the 2×P channel gaps covered with the first dielectric layer 108. The side view of the ink jet printed phased-array antenna 10 illustrated in FIG. 1C shows the cross-sectional view of the phase shifter region 105 taken along line C-C' of the top view of the phase shifters 105 of FIG. 1C.

Figure 1D:
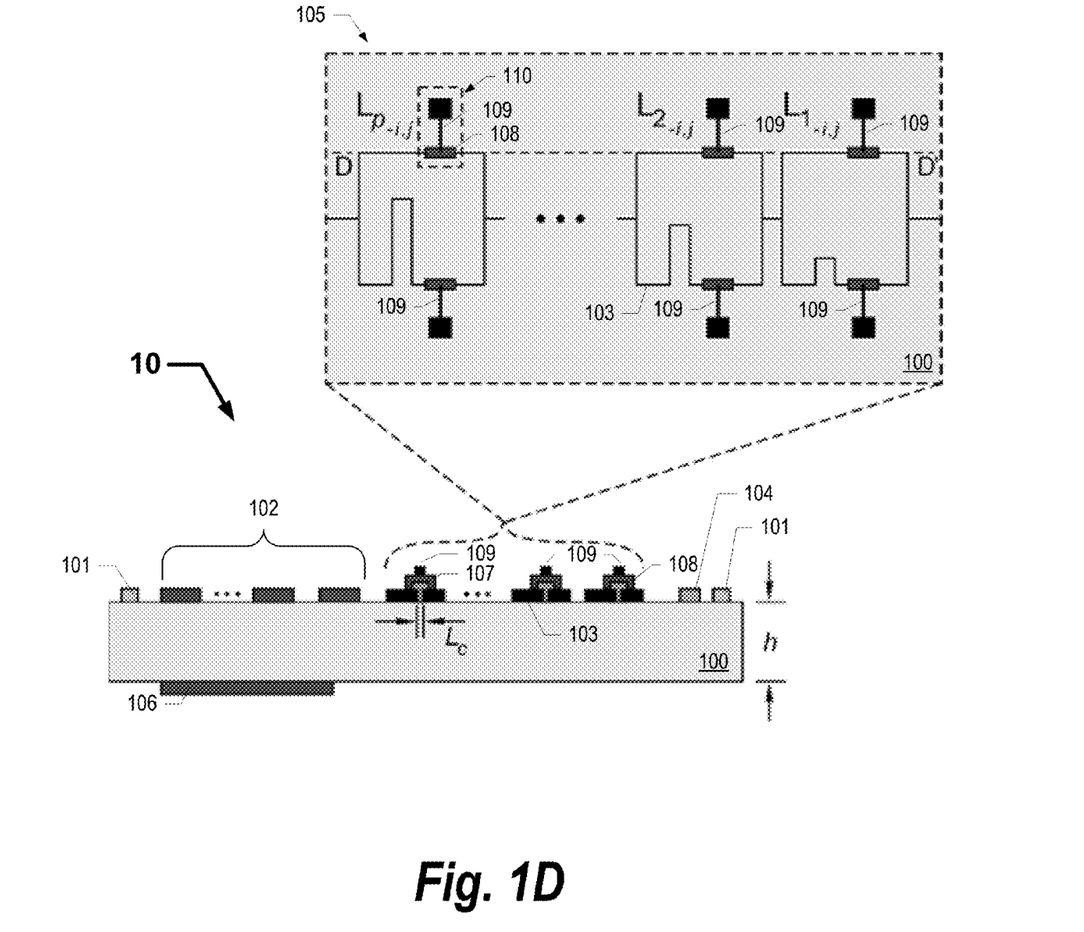

After the printing of the first dielectric layer 108, a second conductive layer 109 is ink-jet printed and hardened, as illustrated in FIG. 1D, on top of the first dielectric layer 108 and the substrate 100 and subsequently cured. The material for the second conductive layer 109 may comprise silver, copper, aluminum, gold, conductive polymers, graphene, and carbon nanotubes, which can be cured through the use of any of the plurality of curing methods, including but not limited to, heating; exposing to UV radiation; exposing to high power short light pulses; and air drying. In order to determine the position of printing on top of the first dielectric layer 108, the alignment marks 101 are detected using an optical system, and the position of printing is determined with respect to the position of the detected alignment marks. The top view of the phase shifters 105 feeding an antenna element in the i-th row and j-th column of the M×N antenna elements 102 shows the 2×P channel regions containing the second conductive layer 109. The side view of the ink jet printed phased-array antenna 10 illustrated in FIG. 1D shows the cross-sectional view of the phase shifter region 105 taken along line D-D' of the top view of the phase shifters 105 of FIG. 1D. The second conductive layer 109 comprises conducting lines running continuously from the top of the first dielectric layer 108 to the top of the substrate 100, wherein conducting contact pads are ink jet printed. The contact pads may be ink jet printed into any shape and size. This step completes the formation of 2×P transistor switches 110 for each group of phase shifters of each of the M×N antenna elements.

Figure 1E:
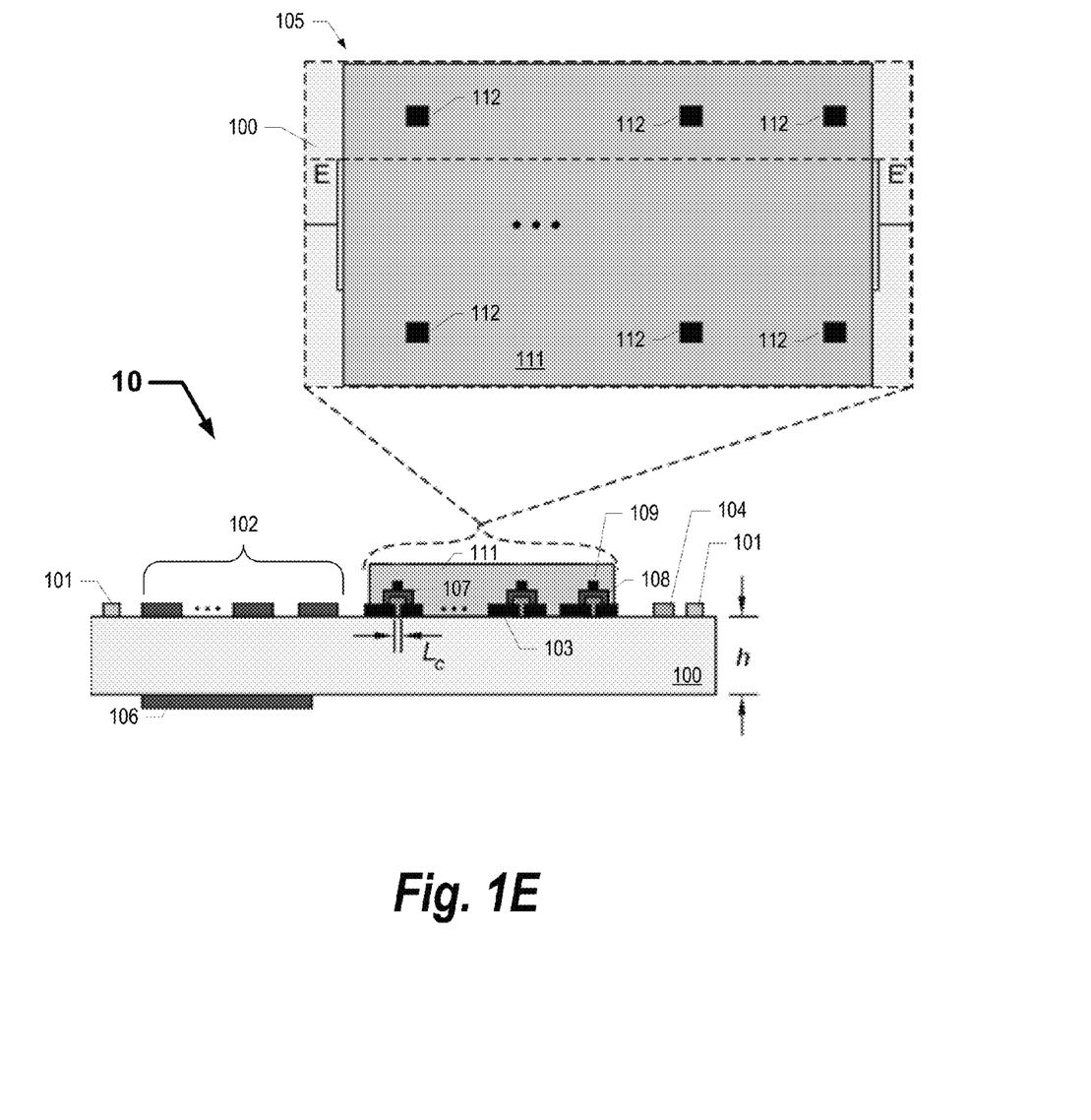

Next, a second dielectric layer 111 is ink jet printed and hardened to cover the phase shifters, as illustrated in FIG. 1E. The second dielectric layer 111 comprises interconnection holes 112, such that the interconnection holes 112 appear over the conducting contact pads of the transistor switches, thus exposing the contact pads of the second conductive layer 109 previously ink-jet printed on the substrate 100. The material for the second dielectric layer 111 may comprise any liquid dielectric material solution, such as a conductive polymer such as SU-8, ion-gel, etc. which can be hardened through the use of the plurality of curing methods, including but not limited to, heating; exposing to UV radiation; exposing to high power short light pulses; and air drying. In order to determine the position of printing the second dielectric layer 111, the alignment marks 101 are detected using an optical system, and the position of printing is determined with respect to the position of the detected alignment marks. The top view of the phase shifters 105 feeding an antenna element in the i-th row and j-th column of the M×N antenna elements 102 shows the second dielectric layer 111 with the interconnection holes 112 exposing the conducting contact pads of the second conductive layer 109. The side view of the ink jet printed phased-array antenna 10 illustrated in FIG. 1E shows the cross-sectional view of the phase shifter region 105 taken along line E-E' of the top view of the phase shifters 105 of FIG. 1E.

Figure 1F:
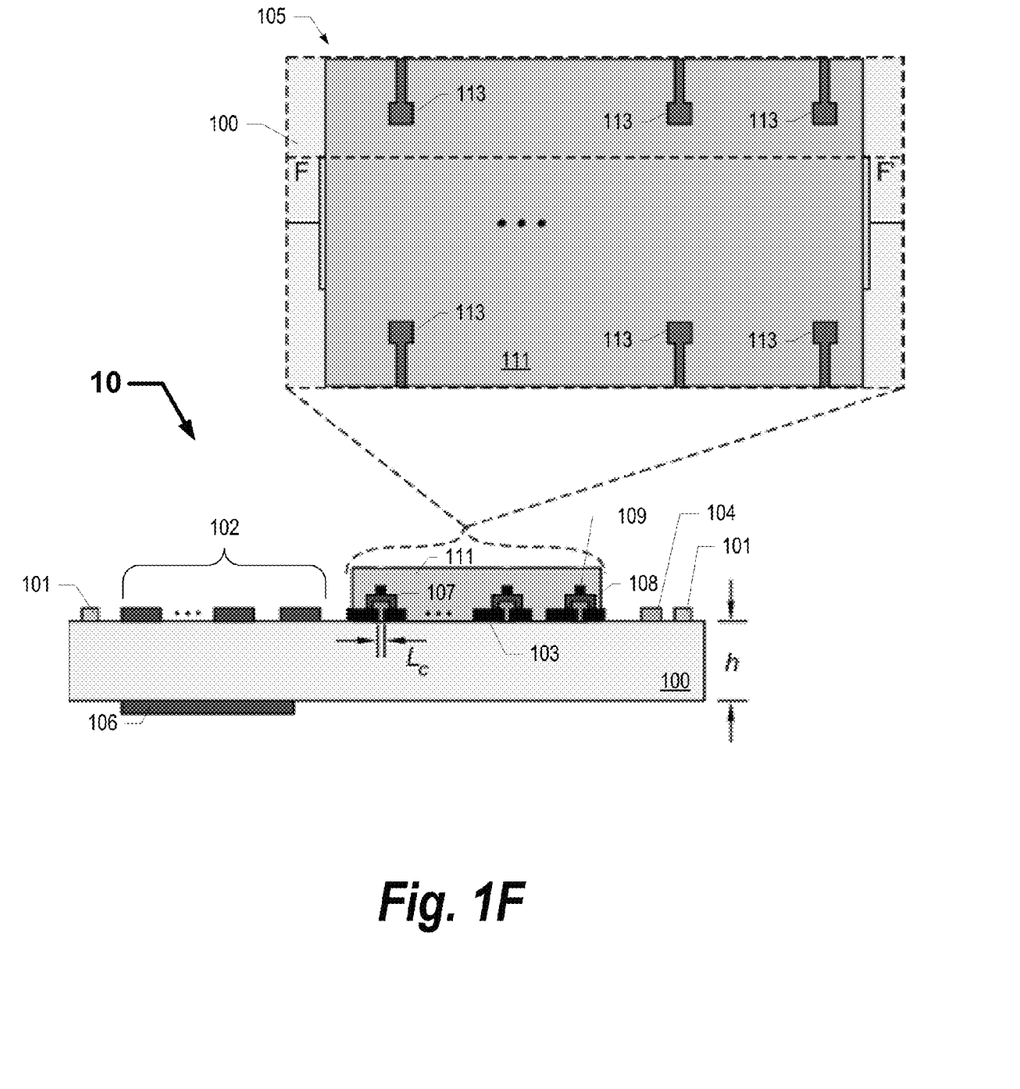

Lastly, a third conductive layer 113 is ink jet printed and hardened into any shape and size on top of the second dielectric layer 111, as illustrated in FIG. 1F. The third conductive layer 113 makes contact with the conductive pads 108 on the substrate 100 by filling the interconnection holes 112 and extending conducting lines in order to enable control of the On/Off states of the transistor switches 110 from the edge of the substrate 100. The material for the third conductive layer 113 may comprise any of the plurality of materials, including but not limited to, silver, copper, aluminum, gold, conductive polymers, graphene, and carbon nanotubes, which can be cured through the use of any of the plurality of curing methods, including but not limited to, heating; exposing to UV radiation; exposing to high power short light pulses; and air drying. In order to determine the position of printing the third conductive layer 113 on top of the second dielectric layer, the alignment marks 101 are detected using an optical system, and the position of printing is determined with respect to the position of the detected alignment marks. The top view of the phase shifters 105 feeding an antenna element in the i-th row and j-th column of the M×N antenna elements 102 shows the third conductive layer 113 with conduction lines emanating from the interconnection holes 112 to the edge of the substrate 100. The side view of the ink jet printed phased-array antenna 10 illustrated in FIG. 1F shows the cross-sectional view of the phase shifter region 105 taken along line F-F' of the top view of the phase shifters 105 of FIG. 1F.

FIG. 2A shows a top view schematic illustration of the ink jet printed M×N, P-bit phased-array antenna 10 after ink jet printing of the second conductive layer as described in FIG. 1D. The multiple sets of three dots in series 201 signify that other devices and objects have not been shown for clarity, but it is understood that a particular number of non-illustrated devices and objects are to be included in order to comprise the M×N, P-bit phased-array antenna. The dashed lines 203 along the transmission lines 103 represent the transmission lines that would lead to the non-illustrated devices and objects. An RF signal applied at the RF coupler 104 is split using cascaded 50:50 power-splitters 205, such that the total physical path length of the transmission lines 103 from the RF coupler 104 to the input of any of the M×N, P-bit phase shifters 210 is substantially equal. The outputs from the M×N, P-bit phase shifters 210 each feed one of the M×N antenna elements 215, in order to form the M×N phased-array antenna. By controlling the On/Off states of the transistor switches 110 through applying a DC voltage through the contact pads of the second conductive layer, 2×P different paths and hence phase shifts for the RF signal can be chosen within each phase shifter. By controlling the On/Off states of the transistor switches 110 in each of the M×N phase shifters, the RF signal can be steered in free space at the antenna array. FIG. 2B shows a top view schematic illustration of the ink jet printed M×N, P-bit phased-array antenna 10 after ink jet printing of the second dielectric layer 111 as described in FIG. 1E. The interconnection holes 112 for each of the P-bit phase shifters 210 expose the conducting contact pads of the second conductive layer 109. FIG. 2C shows a top view schematic illustration of the ink-jet printed M×N, P-bit phased-array antenna 10 after ink-jet printing of the third conductive layer 113 as described in FIG. 1F. The conductive layer 113 provides for electrical continuity to each of the P-bit phase shifters 210 from the edges of the M×N, P-bit phased-array antenna 10.

The multilayer interconnected M×N, P-bit phased-array antenna system 10 formed using this disclosed ink jet printing method may be manufactured on any substrate material and over large physical areas not possible using conventional approaches. The utilization of ink jet printing, enables deposition of material only at intended locations on the substrate, thereby eliminating wastage of expensive dielectric and conductive materials. The method disclosed herein also eliminates the use of material removal using wet or dry etching, thus, further preventing material wastage. Moreover, the utilization of solution processing techniques makes the disclosed invention roll-to-roll compatible, thus lending itself to low cost, high throughput manufacturing.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages that may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

The invention claimed is:

1. A method for manufacturing an M×N, P-bit phased array antenna comprising:
   ink jet printing and hardening a first layer on a substrate, wherein the first layer comprises:
     one or more alignment marks;
     an RF coupler;
     M×N antenna elements; and
     transmission lines, wherein the transmission lines comprise 2×M×N×P channel gap regions;
   ink-jet printing and hardening a first semiconductor layer within each of the 2×M×N×P channel gap regions and on top of the portion of the transmission lines adjacent to each of the 2×M×N×P channel gap regions;
   ink jet printing and hardening a first dielectric layer over the first semiconductor layer and on top of the portion of the transmission lines and of the portion of the substrate adjacent to the first semiconductor layer;
   ink jet printing and hardening a second conductive layer on top of the portion of the first dielectric layer positioned over the 2×M×N×P channel gap regions and on top of the portion of the substrate adjacent to the first dielectric layer, wherein the second conductive layer comprises 2×M×N×P contact pads adjacent to each of the 2×M×N×P channel gap regions with conducting lines from the first dielectric layer positioned over the 2×M×N×P channel gap regions to the 2×M×N×P contact pads;
   ink jet printing and hardening a second dielectric layer on top of substantially the second conductive layer and on top of the portion of the transmission lines and of the portion of the substrate adjacent to the second conductive layer, wherein the second dielectric layer comprises openings positioned over the 2×M×N×P contact pads; and
   ink jet printing and hardening a third conductive layer within each of the openings positioned over the 2×M×N×P contact pads and on top of a portion of the second dielectric layer.

2. The method of claim 1, further comprising ink jet printing and hardening a ground plane on the substrate on the side opposite that of the first layer.

3. The method of claim 1, wherein the ink jet printing and hardening of the first layer comprises:
   determining a position for the one or more alignment marks on the substrate;
   determining positions for the RF coupler, the M×N antenna elements, and the transmission lines relative to the position of the one or more alignment marks;
   depositing a material on the substrate at the position for the one or more alignment marks, at the position for the RF coupler, at the position for the M×N antenna elements, and at the position for the transmission lines, wherein the material comprises at least one of: silver, copper, aluminum, gold, conductive polymer, graphene, and carbon nanotubes; and
   curing the material, wherein curing the material comprises: irradiating the material with UV, heating the material, exposing the material to high power, short light pulses, and/or air drying the material.

4. The method of claim 3, wherein the length of the transmission lines from the RF coupler to 2×M×N of the 2×M×N×P channel gap regions are substantially equal.

5. The method of claim 1, wherein the ink jet printing and hardening of the first semiconductor layer comprises:
   detecting the one or more alignment marks on the substrate;
   depositing a liquid semiconductor material within each of the 2×M×N×P channel gap regions and on top of the portion of the transmission lines adjacent to each of the 2×M×N×P channel gap regions, wherein the liquid semiconductor material comprises at least one of: carbon nanotubes, graphene, organic semiconductors, and silicon nanoparticles; and
   curing the liquid semiconductor material, wherein curing the liquid semiconductor material comprises: irradiating the liquid semiconductor material with UV, heating the liquid semiconductor material, exposing the liquid semiconductor material to high power, short light pulses, and/or air drying the liquid semiconductor material.

6. The method of claim 1, wherein the ink jet printing and hardening of the first dielectric layer comprises:
   detecting the position of the one or more alignment marks on the substrate;
   depositing a liquid dielectric material over the first semiconductor layer and on top of the portion of the transmission lines and of the portion of the substrate adjacent to the first semiconductor layer, wherein the liquid dielectric material comprises a conductive polymer and/or an ion gel; and
   curing the liquid dielectric material, wherein curing the liquid dielectric material comprises: irradiating the liquid dielectric material with UV, heating the liquid dielectric material, exposing the liquid dielectric material to high power, short light pulses, and/or air drying the liquid dielectric material.

7. The method of claim 1, wherein the ink jet printing and hardening of the second conductive layer comprises:
   detecting the position of the one or more alignment marks on the substrate;
   depositing a second liquid conductive material on top of the portion of the first dielectric layer positioned over the 2×M×N×P channel gap regions and on top of the portion of the substrate adjacent to the first dielectric layer, wherein the second liquid conductive material comprises at least one of: silver, copper, aluminum, gold, conductive polymer, graphene, and carbon nanotubes; and
   curing the second liquid conductive material, wherein curing the second liquid conductive material comprises: irradiating the second liquid conductive material with UV, heating the second liquid conductive material, exposing the second liquid conductive material to high power, short light pulses, and/or air drying the second liquid conductive material.

8. The method of claim 1, wherein the ink jet printing and hardening of the second dielectric layer comprises:
   detecting the position of the one or more alignment marks on the substrate;
   depositing a second liquid dielectric material on top of substantially the second conductive layer and on top of the portion of the transmission lines and of the portion of the substrate adjacent to the second conductive layer, wherein the second liquid dielectric material comprises a conductive polymer and/or an ion gel; and
   curing the second liquid dielectric material, wherein curing the second liquid dielectric material comprises: irradiating the second liquid dielectric material with UV, heating the second liquid dielectric material, exposing the second liquid dielectric material to high power, short light pulses, and/or air drying the second liquid dielectric material.

9. The method of claim 1, wherein the ink jet printing and hardening a third conductive layer comprises:
   detecting the position of the one or more alignment marks on the substrate;
   depositing a third liquid conductive material within each of the openings positioned over the 2×M×N×P contact pads and on top of a portion of the second dielectric layer, wherein the third liquid conductive material comprises at least one of: silver, copper, aluminum, gold, conductive polymer, graphene, and carbon nanotubes; and
   curing the third liquid conductive material, wherein curing the third liquid conductive material comprises: irradiating the third liquid conductive material with UV, heating the third liquid dielectric material, exposing the third liquid dielectric material to high power, short light pulses, and/or air drying the third liquid dielectric material.

10. The method of claim 1, wherein the substrate is at least one of: a metal film, a plastic, a paper, a cardboard, and a cloth.

11. The method of claim 1, wherein the substrate comprises an integrated control circuit.

12. The method of claim 11, wherein the integrated control circuit comprises photovoltaic cells, batteries, resistors, and/or capacitors.

13. The method of claim 1, wherein M ranges from 1 to 100.

14. The method of claim 1, wherein N ranges from 1 to 100.

15. The method of claim 1, wherein P ranges from 2 to 8.

16. The method of claim 1, wherein the channel gap of each of the 2×M×N×P channel gap regions ranges from about 1 micron to about 100 microns.

* * * * *